United States Patent [19]
Takiar

[11] Patent Number: 6,024,275
[45] Date of Patent: Feb. 15, 2000

[54] METHOD OF MAKING FLIP CHIP AND BGA INTERCONNECTIONS

[75] Inventor: Hem P. Takiar, Fremont, Calif.

[73] Assignee: National Semiconductor Corporation, Santa Clara, Calif.

[21] Appl. No.: 09/097,856

[22] Filed: Jun. 16, 1998

Related U.S. Application Data

[60] Provisional application No. 60/050,141, Jun. 17, 1997.

[51] Int. Cl.[7] .......................... B23K 31/02; B23K 35/12; B22C 9/20
[52] U.S. Cl. ................... 228/180.22; 228/190; 228/226; 228/234.1; 228/254; 164/322
[58] Field of Search .............................. 228/180.22, 254, 228/190, 234.1, 226; 164/322

[56] References Cited

U.S. PATENT DOCUMENTS

| 5,244,143 | 9/1993 | Ference et al. | 228/180.21 |
| 5,643,831 | 7/1997 | Ochiai et al. | 438/616 |
| 5,673,846 | 10/1997 | Gruber | 228/180.22 |
| 5,718,361 | 2/1998 | Braun et al. | 228/56.3 |
| 5,718,367 | 2/1998 | Covell, II et al. | 228/254 |
| 5,762,259 | 6/1998 | Hubacher et al. | 228/180.22 |
| 5,775,569 | 7/1998 | Berger et al. | 228/254 |
| 5,829,668 | 11/1998 | George et al. | 228/254 |
| 5,873,512 | 2/1999 | Bielick et al. | 228/216 |

Primary Examiner—Patrick Ryan
Assistant Examiner—Kiley Stoner
Attorney, Agent, or Firm—Beyer & Weaver, LLP

[57] ABSTRACT

A method of producing an array of interconnecting contacts for an integrated circuit package, such as a flip chip integrated circuit, and connecting the array of interconnecting contacts to the package utilizes a mold to form the array and attach the array to the package. The method may also be used to interconnect two integrated circuit die. The mold defines a desired shape and relative position for a plurality of interconnecting contacts which make up the array of interconnecting contacts. The array of interconnecting contacts are molded by filling the mold with a desired contact forming material such as solder paste. The mold containing the molded array of interconnecting contacts is positioned adjacent to the integrated circuit package such that each interconnecting contact is positioned adjacent to a corresponding contact pad of the integrated circuit package. And finally, the molded interconnecting contacts are attached to their corresponding contact pads of the integrated circuit package. In the case in which solder paste is utilized as the molding material, the solder is reflowed to attach the array to the package.

15 Claims, 4 Drawing Sheets

METHOD OF MAKING FLIP CHIP AND BGA INTERCONNECTIONS

This application claims priority of U.S. Provisional Application No. 60/050,141 filed on Jun. 17, 1997 under 35 U.S.C. §119 (e).

BACKGROUND OF THE INVENTION

The present invention relates generally to integrated circuit (IC) packages and more specifically to a method of making an array of interconnecting contacts for an IC package such as a Ball Grid Array (BGA) package or a flip chip package.

In the IC packaging industry, there is continuous pressure to reduce the cost of packaging ICs. To accomplish this, a wide variety of package designs have been developed. One of the currently used techniques involves using an array of interconnecting contacts made up of solder balls or solder columns to provide the interconnection between the IC of the package and other electrical components external to the package such as a PC board. Flip chip ICs and BGA packages are two common examples of packages that use these arrays of interconnecting contacts.

The arrays of interconnecting contacts are typically formed using one of two general processes. In the first process, an array of solder balls is formed by forming each of the solder balls individually on corresponding contact pads located either on the IC itself, or on other electrical interconnecting elements of the package such as leads or traces. In the second process, each of the contacts is formed by soldering (typically using a low temperature solder) a pre-formed solder column (typically made from a high temperature solder) to each of the contact pads of the package. Both of these processes may be somewhat time consuming, and therefore more costly, especially as the number of contacts included in the array of interconnecting contacts is increased.

The above described approaches of forming an array of interconnecting contacts result in more cost effective packages than the traditional approach to producing IC packages which utilizes a lead frame and bonding wires to form the interconnection between the IC and other electrical components external to the package. However, as mentioned above, it is desirable to further reduce the costs of packaging ICs wherever possible. The present invention provides methods for further reducing the cost of producing an array of interconnecting contacts for an integrated circuit package such as a BGA package or a flip chip package.

SUMMARY OF THE INVENTION

As will be described in more detail hereinafter, a method of producing an array of interconnecting contacts for an integrated circuit package, such as a flip chip integrated circuit or a BGA package, and connecting the array of interconnecting contacts to the package is herein disclosed. The method may also be used to interconnect two integrated circuit die. The method utilizes a mold which defines a desired shape and relative position for a plurality of interconnecting contacts which make up the array of interconnecting contacts. The array of interconnecting contacts are molded by filling the mold with a desired contact forming material. The mold containing the molded array of interconnecting contacts is positioned adjacent to the integrated circuit package such that each interconnecting contact is positioned adjacent to a corresponding contact pad of the integrated circuit package. And finally, the molded interconnecting contacts are attached to their corresponding contact pads of the integrated circuit package.

In one embodiment, the contact forming material is solder paste. In this embodiment, all of the molded interconnecting contacts are attached to their corresponding contact pads of the integrated circuit package by reflowing the solder paste. The step of reflowing the solder paste to attach the array of contacts to their corresponding contact pads of the integrated circuit package may also be used to initially reflow the solder paste in order to form the array of interconnecting contacts at the same time that the interconnecting contacts are attached to the integrated circuit package. Alternatively, after the step of filling the mold with solder paste and prior to the step of positioning the mold adjacent to the integrated circuit package, the method may further include the step of initially reflowing the solder paste in the mold in order to form the array of interconnecting contacts prior to being attached to the integrated circuit package. The array of interconnecting contacts may be molded in the form of solder balls or solder columns.

In another embodiment, the step of providing the mold may include the step of providing a plurality of molds. In this case, the plurality of molds are configured such that, when the molds are stacked adjacent to one another, the molds form an overall mold which defines the desired shape and relative position for the plurality of interconnecting contacts which make up the array of interconnecting contacts. In the case in which solder paste is used to form the array of contacts, each of the plurality of molds is filled with solder paste. Each of the plurality of molds is positioned adjacent to the package and the solder paste is reflowed thereby attaching in layers all of the interconnecting contacts of the array of interconnecting contacts to their corresponding contact pads of the integrated circuit package.

In the embodiment in which a plurality of molds are used, each mold may be filed with a different molding material. For example, a low temperature solder paste may be used to fill a first and a third one of the molds and a high temperature solder paste may be used to fill a second one of the molds. In this example, the mold containing the high temperature solder paste is reflowed after the step of filling the molds with solder paste and prior to the step of positioning the molds adjacent to the integrated circuit package. This reflowing forms a high temperature solder portion of the array of interconnecting contacts. The three molds are positioned adjacent to the package and the low temperature solder is reflowed thereby attaching the three layers of the array of interconnecting contacts to their corresponding contact pads of the integrated circuit package.

BRIEF DESCRIPTION OF THE DRAWINGS

The features of the present invention may best be understood by reference to the following description of the presently preferred embodiments together with the accompanying drawings.

DETAILED DESCRIPTION OF THE PREFERRED EMBODIMENTS

An invention is herein described for providing methods for forming an array of interconnecting contacts for an integrated circuit package such as a BGA package or a flip chip package. The methods may also be used to interconnect two integrated circuit die. In the following description, numerous specific details are set forth in order to provide a thorough understanding of the present invention. However, in view of this description, it will be obvious to one skilled in the art that the present invention may be embodied in a wide variety of specific configurations. Also, well known integrated circuit package manufacturing processes such as solder reflowing processes, integrated circuit package encapsulating or molding processes, and other such conventional integrated circuit manufacturing processes will not be described in detail in order not to unnecessarily obscure the present invention.

Figure 1:
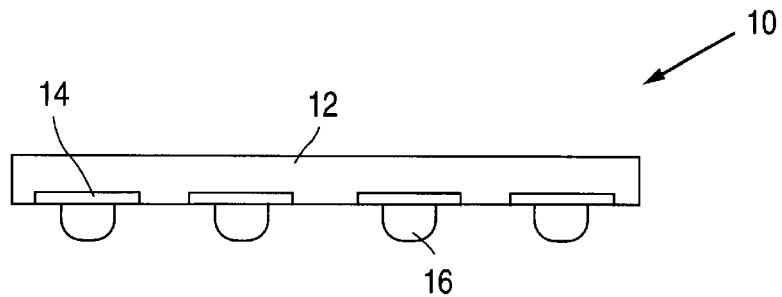
FIG. 1 is a diagrammatic cross-sectional view of one embodiment of a flip chip package manufactured in accordance with the present invention.

Referring initially to FIG. 1, an integrated circuit package 10 manufactured using one embodiment of a method in accordance with the invention will initially be described. FIG. 1 illustrates a diagrammatic cross-sectional view of package 10. For this embodiment, package 10 takes the form of a flip chip package which includes an integrated circuit die 12. Die 12 has a plurality of contact pads 14 located on the bottom surface of die 12. Flip chip package 10 also includes an array of interconnecting contacts 16. Each contact 16 is formed on an associated one of contact pads 14 of die 12.

Figure 2A:
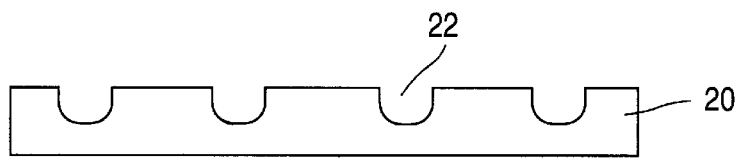
FIGS. 2a–c are diagrammatic illustrations of the process steps used to manufacture the flip chip package of FIG. 1.
Figure 2B:
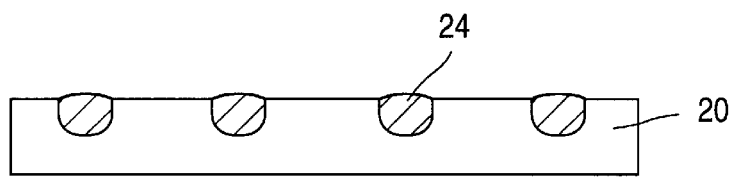
Figure 2C:
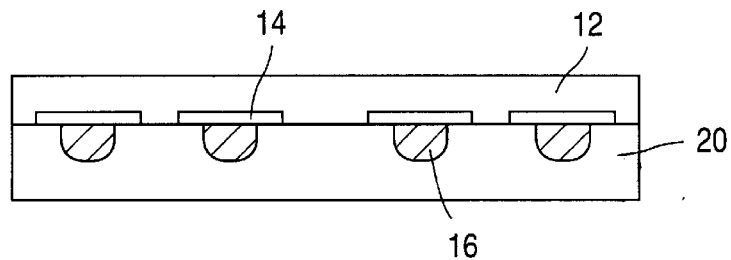

FIGS. 2a–c illustrate the various process steps of one embodiment of a method in accordance with the invention used to produce the array of interconnecting contacts 16 shown in FIG. 1. As illustrated in FIG. 2a, a mold fixture 20 designed in accordance with the invention is used to produce the array of interconnecting contacts. Mold 20 includes a plurality of openings or cavities 22 which define a desired shape and relative positions for the plurality of interconnecting contacts 16. As shown in FIG. 2b, cavities 22 are filled with a contact forming material 24. In this embodiment, contact forming material 24 is a solder paste. If solder paste is used as the contact forming material, the process may optionally include the additional step of heating the mold at this point to flow the solder paste and form the array of interconnecting contacts 16.

As illustrated in FIG. 2c, after the mold has been filled with contact forming material 24, mold 20 is then positioned adjacent to integrated circuit die 12. Mold 20 is positioned such that each of the cavities 22 containing the contact forming material 24 are positioned adjacent to a corresponding contact pad 14 of die 12 with material 24 in each cavity 22 being in contact with a corresponding contact pad 14 on die 12. The molded interconnecting contacts 16 are then attached to their corresponding contact pads 14 of the die 12. In this embodiment, the step of attaching the contacts is accomplished by heating mold 20. If the previously described optional step of heating the mold to form the interconnecting contacts has not be performed, the attaching step is accomplished by heating the mold to flow the solder paste thereby forming the interconnecting contacts 16 and, at the same time, attaching the contacts 16 to the die 12. Alternatively, if the optional step of heating the mold prior to positioning the mold adjacent the die has been performed, the attaching step is accomplished by heating the mold and reflowing the solder in order to attach the interconnecting contacts 16 to contact pads 14 of die 12. This step completes the process of forming and attaching the interconnecting contacts and the mold may be removed.

Mold 20 may be made from any suitable material depending upon the contact forming material that is used to form the contacts. In the case in which solder paste is used, the mold must be made from a material which can withstand the temperatures necessary to heat, flow, and reflow the solder paste. The mold is preferably coated with Teflon or some other non-stick material to assist in the removal of the mold. Alternatively, mold release agents may be used to facilitate the removal of the mold.

The mold may be filled with contact forming material in any appropriate manner depending on the contact forming material being used. In the case of solder paste, the solder paste may be spread into the mold openings and leveled off using a squeegee or any other suitable and readily providable tool. Alternatively, the mold may be filled with molten solder rather than solder paste.

Although the contact forming material has been described above as being solder paste or molten solder, this is not a requirement of the invention. Instead, the contact forming material may be any suitable and readily providable electrically conductive material that is capable of being molded. For example, contact forming material 24 may be an electrically conductive molding compound such as an electrically conductive epoxy mixture containing an electrically conductive powder such as copper powder.

Molded contacts 16 may take a wide variety of specific shapes such as balls, columns, or any other desired shape so long as the shape allows the contacts to be molded and attached to the desired integrated circuit die or package. For purposes of molding, it is preferable for the cavities in the mold to have a shape which facilitates the easy removal of the mold after the interconnecting contacts have been attached to the integrated circuit die or package.

Figure 3:
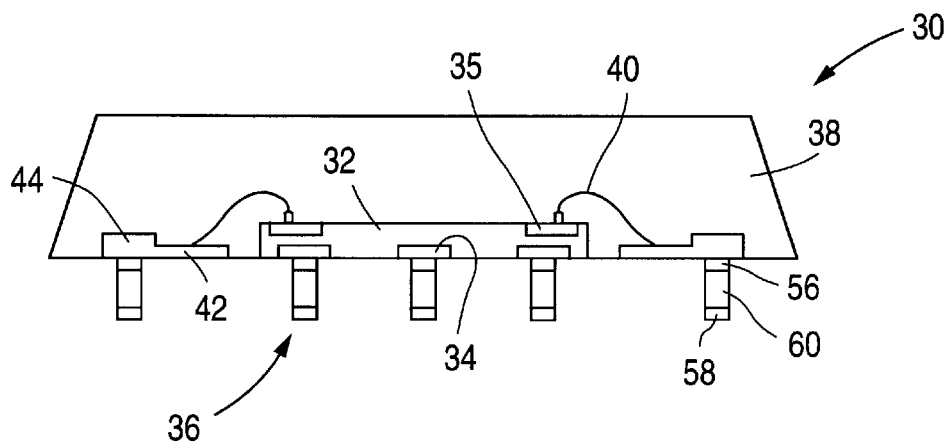
FIG. 3 is a diagrammatic cross-sectional view of one embodiment of a BGA package manufactured in accordance with the present invention.

Although the mold has been described to this point as being a one piece mold, this is not a requirement of the invention. Instead, for certain situations it may be desirable to use multiple mold pieces. FIG. 3 illustrates a BGA integrated circuit package 30 manufactured in accordance with another embodiment of a method of the present invention.

As shown in FIG. 3, which illustrates a diagrammatic cross-sectional view of package 30, package 30 includes an integrated circuit die 32 having a plurality of input/output terminal pads 34 located on the bottom surface of die 32 and a plurality of input/output terminal pads 35 located on the top surface of die 32. Package 30 also includes a plurality of interconnecting contacts 36 and encapsulating material 38 surrounding the top portions of die 32. In this embodiment, the plurality of input/output terminal pads 34 located on the bottom surface of die 32 act as contact pads as described above for FIG. 1. However, package 30 also includes an array of bonding wires 40 and electrically conductive leads or traces 42 which electrically connect the input/output terminal pads 35 located on the top surface of die 32 to additional contact pads 44 located around the periphery of die 32. In a manner similar to that described above for FIG. 1, each interconnecting contact 36 is formed on an associated one of either contact pads 44 or input/output terminal pads 34.

Although BGA package 30 has been described as having a particular internal configuration which includes a die having input/output terminal pads on both its top and bottom surfaces and bonding wires and leads to connect the terminal pads on top of the die to the contact pads, these elements are not a requirement of the invention. Instead, it is to be understood that the invention would equally apply regardless of the specific internal configuration of the package. The example of BGA package 30 is used to illustrate the variety of internal package configurations to which the methods of the invention may be applied.

Figure 4A:
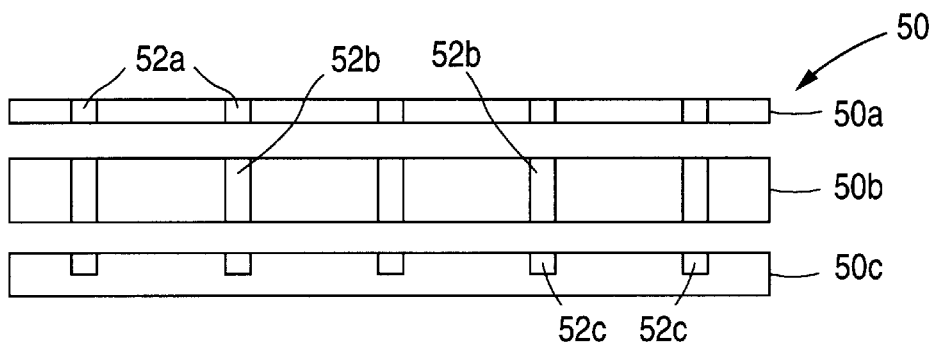
FIGS. 4a–c are diagrammatic illustrations of the process steps used to manufacture the BGA package of FIG. 3.
Figure 4B:
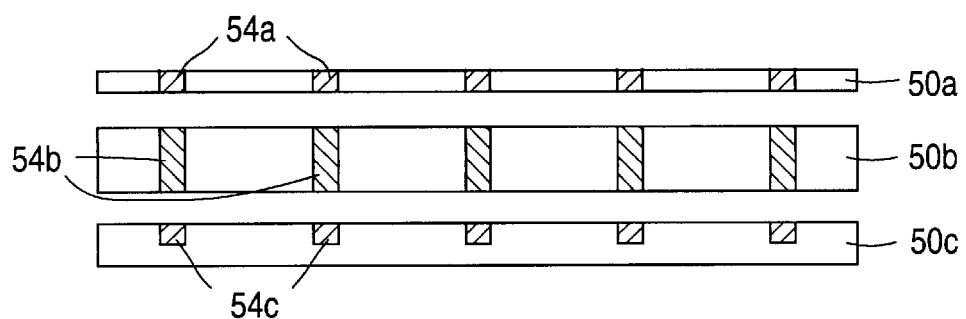
Figure 4C:
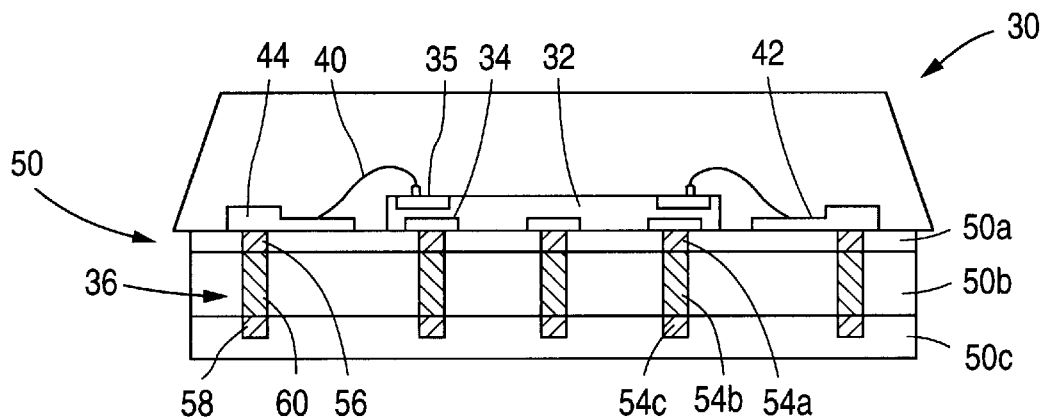

FIGS. 4a–c illustrate the various process steps of one embodiment of a method in accordance with the invention used to produce the array of interconnecting contacts 36 shown in FIG. 3. As illustrated in FIG. 4a and in accordance with the invention, a mold fixture 50 made up of a plurality of individual mold parts 50a–50c is used to produce the array of interconnecting contacts 36. Each of mold parts 50a–50c includes a plurality of openings or cavities 52a–c, within mold parts 50a–c respectively, which define a desired shape and relative positions for the plurality of interconnecting contacts 36. As shown in FIG. 4b, cavities 52a–c are filled with a contact forming material 54. In this embodiment, contact forming material 54 is a solder paste and mold parts 50a and 50c are filled with a low temperature solder paste and mold part 50b is filled with a high temperature solder paste.

In the embodiment being described, the interconnecting contacts 36 take the form of solder columns. As shown best in FIG. 3, each solder column contact 36 is made up of three layers of solder. A first layer 56, which is immediately adjacent to package 30, and a third layer 58, which is furthest from package 30, are both formed using a low temperature solder paste molded in mold pieces 50a and 50c respectively. A central portion 60 of each solder column contact 36 is formed using a high temperature solder paste molded in mold part 50b.

In this embodiment of the method, at least mold part 50b is heated at a high temperature to flow the high temperature solder paste and form central portions 60 of the array of interconnecting contacts 36 prior to the step of attaching the interconnecting contacts to the package. Mold parts 50a and 50c may also be heated at a lower temperature to flow the low temperature solder paste and form first layer 56 and third layer 58 of the array of interconnecting contacts prior to being positioned adjacent to and attached to package 30.

As illustrated in FIG. 4c, after the mold parts have been filled with the appropriate contact forming material and mold part 50b has been heated to form high temperature central portions 60, mold parts 50a–c are then stacked and positioned adjacent to package 30. Overall mold 50 is positioned such that each of the overall cavities 52 containing the three layers of contact forming material 54 are positioned adjacent to a corresponding contact pad 44 or terminal pad 34 with first layer 56 of the contact forming material 54 in each cavity 52 being in contact with a corresponding contact pad 44 or terminal pad 34. The molded interconnecting contacts 36 are then attached to their corresponding contact pads 44 or terminal pads 34.

If the previously described optional step of heating mold parts 50a and 50c to form the first and third layers of the interconnecting contacts has not be performed, the attaching step is accomplished by heating and flowing the low temperature layers 56 and 58 of the contact forming material 54 thereby forming the interconnecting contacts 36 and, at the same time, attaching each of the layers of contacts 36 to package 30. Alternatively, if the optional step of heating mold parts 50a and 50c prior to positioning the mold adjacent the package has been performed, the attaching step is accomplished by heating the overall mold and reflowing the low temperature solder in order to attach the three layers of interconnecting contacts 36 to package 30.

Although the step of attaching the contacts to the package has been described as stacking the mold parts and attaching all of the layers at the same time, this is not a requirement. Instead, each of the mold parts may be successively positioned adjacent to the package and heated to attach each layer one at a time. Also, although the mold has been described as including three mold parts, this is not a requirement. Instead, any number of mold parts may be used depending on the requirements of the specific embodiment.

One of the advantages of the multi-layered approach described above is that the high temperature central portions of the contacts may be made from a high temperature material that will not reflow at temperatures used during subsequent processes such as attaching the package to a PC board or other component. This means that the high temperature central portions will remain rigid and may act as spacers that help prevent any excess solder from causing a short between adjacent contacts.

Figure 5:
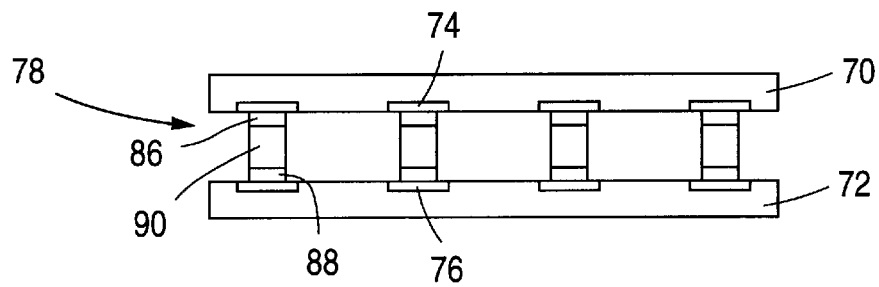
FIG. 5 is a diagrammatic cross-sectional view of two integrated circuit die interconnected using one embodiment of a method in accordance with the present invention.

Although the above described embodiments have been described in terms of making interconnecting contacts for an integrated circuit package such as a flip chip package or a BGA package, a similar process may also be used to interconnect two integrated circuit die. FIG. 5 is a diagrammatic cross-sectional view of two integrated circuit die 70 and 72 interconnected using one embodiment of a method in accordance with the present invention.

As shown in FIG. 5, die 70 and 72 have a plurality of input/output terminal pads 74 and 76, respectively located on the bottom surface of die 72 and the top surface of die 74. A plurality of interconnecting contacts 78 interconnect corresponding ones of input/output terminal pads 74 to associated ones of input/output terminal pads 76.

Figure 6A:
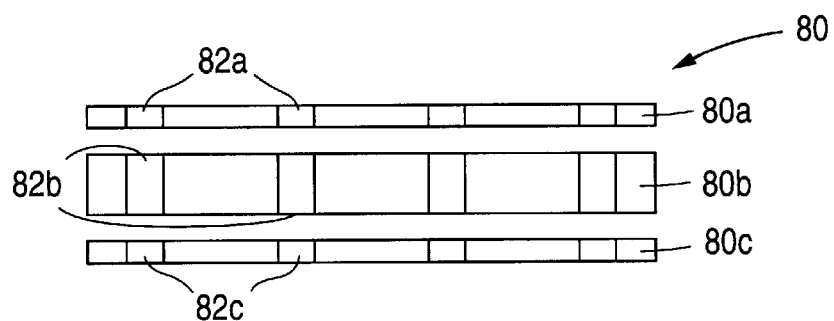
FIGS. 6a–d are diagrammatic illustrations of the process steps used to interconnect the two integrated circuit die of FIG. 6.
Figure 6B:
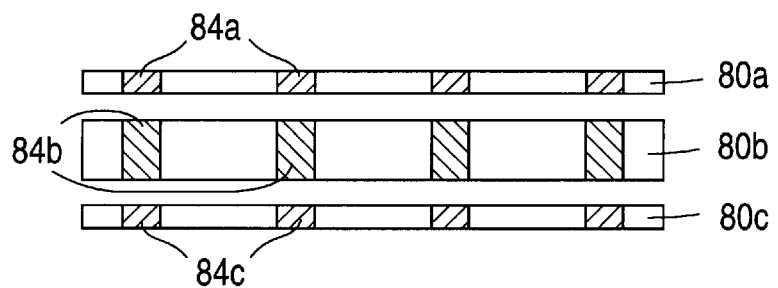

As described above for FIGS. 4a–c and as illustrated in FIGS. 6a–d, interconnecting contacts 78 are formed using three mold parts. As illustrated in FIG. 6a a mold fixture 80 made up of a plurality of individual mold parts 80a–80c is used to produce the array of interconnecting contacts 78. Each of mold parts 80a–80c includes a plurality of openings or cavities 82a–c, within mold parts 80 a–c respectively. These openings together define a desired shape and relative positions for the plurality of interconnecting contacts 78. As shown in FIG. 6b, cavities 82a–c are filled with a contact forming material 84. In this embodiment, contact forming material 84 is a solder paste and mold parts 80a and 80c are filled with a low temperature solder paste and mold part 80b is filled with a high temperature solder paste. In manner similar to that described above for FIG. 4b and as shown best in FIG. 5, mold parts 80a and 80c are used to form low temperature contact portions 86 and 88 respectively and mold part 80b is used to form high temperature contact portion 90.

In this embodiment of the method, mold part 80b is heated at a high temperature to flow the high temperature solder paste and form central portions 90 of the array of interconnecting contacts 78. This heating step is done prior to positioning mold part 80b adjacent to either of the die for purposes of attaching the interconnecting contacts to the die. Mold parts 80a and 80c may also be heated prior to being positioned adjacent to one of the die. They may be heated at a lower temperature in order to flow the low temperature solder paste and form contact portions 86 and 88 of the array of interconnecting contacts.

Figure 6C:
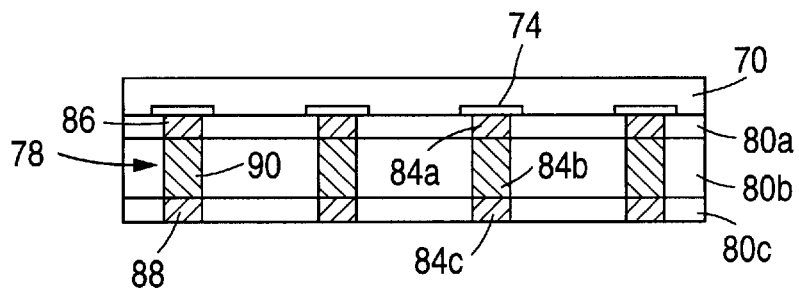

As illustrated in FIG. 6c, after the mold parts have been filled with the appropriate contact forming material and mold part 80b has been heated to form high temperature central portions 90, mold parts 80a–c are then stacked and positioned adjacent to die 70. The molded interconnecting contacts 78 are then attached to their corresponding contact pads 74 on die 70 in a manner similar to that described above for FIG. 4c. Alternatively, each of the mold parts 80a–c may be successively positioned adjacent die 70 and heated thereby attaching the interconnecting contacts to the die one layer at a time.

Figure 6D:
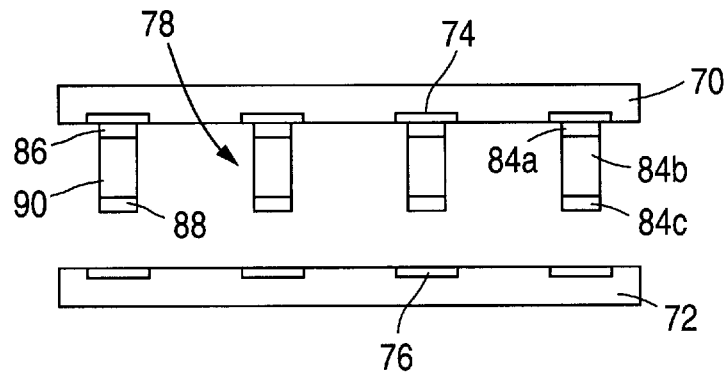

And finally, as illustrated in FIG. 6d, the assembly of FIG. 6c, that is die 70 with its attached interconnecting contacts, is positioned adjacent die 72 such that the input/output terminal pads 76 are positioned adjacent and in contact with their corresponding interconnecting contacts 78. The low temperature portions of interconnecting contacts 78 are then reflowed by heating the assembly to a temperature sufficient to reflow the low temperature solder but not reflow the high temperature solder.

Although the various layers of the interconnecting contacts have been described as all being attached to one die prior to attaching the second die, this is not a requirement. Instead, the two low temperature potions of the array of contacts may be first attached to their respective die. Then the high temperature central portion of the array may be attached to one or the other of the die by reflowing the low temperature portion of the array of contacts already attached to the die. And finally, the second die would then be attached to the first die.

Although only three specific embodiments of methods in accordance with the invention have been described above in detail, it is to be understood that the methods of the present invention may be embodied in a wide variety of alternatives forms and still remain within the scope of the invention. Any of these various embodiments would equally fall within the scope of the invention so long as the array of interconnecting contacts are molded from a contact forming material. For example, although the integrated circuit packages of the first two embodiments were described as a flip chip package and a BGA package, it is to be understood that the invention is not limited to these specific package types. Instead, the invention would equally apply to any type of package so long as the interconnecting contacts are molded.

Also, although the various embodiments have been described with the various components having particular respective orientations, it should be understood that the present invention may take on a wide variety of specific configurations with the various components being located in a wide variety of positions and mutual orientations and still remain within the scope of the present invention. Therefore, the present examples are to be considered as illustrative and not restrictive, and the invention is not to be limited to the details given herein, but may be modified within the scope of the appended claims.

What is claimed is:

1. A method of producing an array of interconnecting contacts for an integrated circuit package and connecting the array of interconnecting contacts to the package, the method comprising the steps of:
    a) providing an integrated circuit package having a plurality of contact pads to which an array of interconnecting contacts is to be attached;
    b) providing three molds, the three molds being configured such that, when the molds are stacked adjacent to one another, the molds form an overall mold which defines a desired shape and relative position for a plurality of interconnecting contacts which make up the array of interconnecting contacts;
    c) molding the array of interconnecting contacts by filling a first and a third mold with a low temperature contact forming material and filling a second mold with a high temperature contact forming material;
    d) positioning the three molds containing the molded array of interconnecting contacts adjacent to the integrated circuit package in order from the first mold to the third mold such that each interconnecting contact is positioned adjacent to a corresponding contact pad of the integrated circuit package; and
    e) attaching the molded interconnecting contacts to their corresponding contact pads of the integrated circuit package.

2. A method according to claim 1 wherein:
    a) the step of molding the array of interconnecting contacts includes the step of filling the mold with solder paste; and
    b) the step of attaching the molded interconnecting contacts includes the step of reflowing the solder paste to attach all of the contacts of the array of contacts to their corresponding contact pads of the integrated circuit package.

3. A method according to claim 2 wherein the step of reflowing the solder paste to attach all of the contacts of the array of contacts to their corresponding contact pads of the integrated circuit package is used to initially reflow the solder paste in order to form the array of interconnecting contacts at the same time that the interconnecting contacts are attached to the integrated circuit package.

4. A method according to claim 2 wherein after the step of filling the mold with solder paste and prior to the step of positioning the mold adjacent to the integrated circuit package, the method further includes the step of initially reflowing the solder paste in the mold in order to form the array of interconnecting contacts prior to being attached to the integrated circuit package.

5. A method according to claim 2 wherein the array of interconnecting contacts are solder balls.

6. A method according to claim 2 wherein the array of interconnecting contacts are solder columns.

7. A method according to claim 1 wherein the integrated circuit package is a flip chip integrated circuit.

8. A method of interconnecting two integrated circuit die, the method comprising the steps of:
    a) providing two integrated circuit die, each having a plurality of contact pads to which an array of interconnecting contacts is to be attached;
    b) providing three molds, the three molds being configured such that, when the molds are stacked adjacent to one another, the molds form an overall mold which defines a desired shape and relative position for a plurality of interconnecting contacts which make up the array of interconnecting contacts;
    c) molding the array of interconnecting contacts by filling a first and a third mold with a low temperature contact forming material and filling a second mold with a high temperature contact forming material;
    d) positioning the three molds containing the molded array of interconnecting contacts adjacent to a first one of the two integrated circuit die in order from the first mold to the third mold such that each interconnecting contact is positioned adjacent to a corresponding contact pad of the first integrated circuit die;

e) attaching the molded interconnecting contacts to their corresponding contact pads of the first integrated circuit die;

f) positioning the second integrated circuit adjacent to the array of interconnecting contacts attached to the first integrated circuit die such that each interconnecting contact of the array is positioned adjacent to a corresponding contact pad of the second integrated circuit die; and g) attaching the molded interconnecting contacts to their corresponding contact pads of the second integrated circuit die.

9. A method according to claim 8 wherein:

a) the step of molding the array of interconnecting contacts includes the step of filling the mold with solder paste; and b) the two steps of attaching the molded interconnecting contacts to the firsts and second integrated circuit package includes the step of reflowing the solder paste to attach all of the contacts of the array of contacts to their corresponding contact pads of the integrated circuit die.

10. A method according to claim 9 wherein the step of reflowing the solder paste to attach all of the contacts of the array of contacts to their corresponding contact pads of the first integrated circuit die is also used to initially reflow the solder paste in order to form the array of interconnecting contacts at the same time that the interconnecting contacts are attached to the first integrated circuit die.

11. A method according to claim 9 wherein after the step of filling the mold with solder paste and prior to the step of positioning the mold adjacent to the first integrated circuit die, the method further includes the step of initially reflowing the solder paste in the mold in order to form the array of interconnecting contacts prior to being attached to the first integrated circuit die.

12. A method according to claim 9 wherein the array of interconnecting contacts are solder balls.

13. A method according to claim 9 wherein the array of interconnecting contacts are solder columns.

14. A method according to claim 2 wherein the step of reflowing the solder paste in each of the molds positioned adjacent to the package includes the step of reflowing the low temperature solder paste when the three molds are positioned adjacent to the package thereby attaching three layers of the array of interconnecting contacts to their corresponding contact pads of the integrated circuit package.

15. A method according to claim 9 wherein the step of reflowing the solder paste in each of the molds positioned adjacent to the first integrated circuit die includes the step of reflowing the low temperature solder paste when the three molds are positioned adjacent to the package thereby attaching three layers of the array of interconnecting contacts to their corresponding contact pads of the first integrated circuit die.

* * * * *